(12) United States Patent
Shimizu et al.

(10) Patent No.: US 12,485,534 B2
(45) Date of Patent: *Dec. 2, 2025

(54) ROBOT AND SUBSTRATE ORIENTATION EXAMINATION METHOD

(71) Applicant: KAWASAKI JUKOGYO KABUSHIKI KAISHA, Kobe (JP)

(72) Inventors: Ippei Shimizu, Kobe (JP); Hiroyuki Okada, Kakogawa (JP); Daisuke Yamanaka, Oshu (JP); Takahiro Abe, Fuchu (JP); Junichi Sato, Oshu (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 290 days.

This patent is subject to a terminal disclaimer.

(21) Appl. No.: 18/024,508

(22) PCT Filed: Aug. 29, 2021

(86) PCT No.: PCT/JP2021/031627
§ 371 (c)(1),
(2) Date: Mar. 3, 2023

(87) PCT Pub. No.: WO2022/050201
PCT Pub. Date: Mar. 10, 2022

(65) Prior Publication Data
US 2024/0025037 A1      Jan. 25, 2024

(30) Foreign Application Priority Data
Sep. 4, 2020   (JP) .................................. 2020-148882

(51) Int. Cl.
*B25J 9/16* (2006.01)
*B25J 11/00* (2006.01)
*B25J 13/08* (2006.01)

(52) U.S. Cl.
CPC .......... *B25J 9/1612* (2013.01); *B25J 11/0095* (2013.01); *B25J 13/088* (2013.01)

(58) Field of Classification Search
CPC . H01L 21/68; H01L 21/681; H01L 21/67742; H01L 21/67766;
(Continued)

(56) References Cited

U.S. PATENT DOCUMENTS 9,099,508 B2 *  8/2015  Hertgens ........... H01L 21/67259
2004/0068347 A1 *  4/2004  Aalund ............. H01L 21/68707
318/568.11
(Continued)

FOREIGN PATENT DOCUMENTS

JP      7-153818 A       6/1995
JP      2002289673 A  * 10/2002
(Continued)

*Primary Examiner* — Gerald McClain
(74) *Attorney, Agent, or Firm* — XSENSUS LLP (57) ABSTRACT

A robot that transfers a substrate includes a hand, an arm, a substrate detector, and a substrate orientation examiner. The hand holds and transfers the substrate. The arm is connected to the hand and moves the hand. The substrate detector detects absence or presence of the substrate in a non-contact manner. The substrate orientation examiner examines an orientation of the substrate based on a height detected by the substrate detector at which the substrate is located when it is not held by the hand.

16 Claims, 6 Drawing Sheets

(58) Field of Classification Search
CPC .............. H01L 21/68707; B25J 9/1612; B25J 11/0095; B25J 13/088
See application file for complete search history.

(56) References Cited

U.S. PATENT DOCUMENTS

| | | | | |
|---|---|---|---|---|
| 2016/0158935 | A1* | 6/2016 | Inomata | B25J 9/0081 700/214 |
| 2022/0108911 | A1* | 4/2022 | Murata | H01L 21/681 |
| 2023/0321839 | A1* | 10/2023 | Shimizu | B25J 11/0095 414/222.01 |

FOREIGN PATENT DOCUMENTS

| | | | | | |
|---|---|---|---|---|---|
| JP | 2004-128021 | A | | 4/2004 | |
| JP | 2019149478 | A | * | 9/2019 | ............ H01L 21/67 |
| JP | 2020-53416 | A | | 4/2020 | |
| JP | 2020053416 | A | * | 4/2020 | |

* cited by examiner

FIG. 4 hand insertion direction

FIRST VARIATION hand insertion direction

FIG. 8

SECOND VARIATION hand insertion direction

FIG. 9

THIRD VARIATION directions in which
robot hand is moved
to obtain detected thickness

ROBOT AND SUBSTRATE ORIENTATION EXAMINATION METHOD

CROSS-REFERENCE TO RELATED APPLICATIONS

The present application is based on PCT filing PCT/JP2021/031627, filed Aug. 29, 2021, which claims priority to JP 2020-148882, filed Sep. 4, 2020, the entire contents of each are incorporated herein by reference.

TECHNICAL FIELD

The present disclosure chiefly relates to a robot that transfers substrates, such as semiconductor wafers and printed circuit boards. More particularly, the present disclosure relates to a configuration for detecting an orientation of a substrate to be transferred before holding it.

BACKGROUND ART

Conventionally, there has been a known robot for transferring a substrate that takes out a substrate from a substrate storage apparatus, a substrate processing apparatus, or the like, and transfers it. PTL 1 discloses a wafer transfer apparatus, which is a robot of this type.

The wafer transfer apparatus of PTL 1 includes an orientation detector that detects an orientation of a hand and an actuator. In this wafer transfer apparatus, the orientation of the hand is adjusted by controlling a degree of expansion and contraction of the actuator based on information of the orientation of the hand detected by the orientation detector.

PRIOR-ART DOCUMENTS

Patent Documents

PTL 1: Japanese Patent Application Publication No. 2004-128021

SUMMARY OF THE INVENTION

Problems to be Solved by the Invention

The orientation detector of PTL 1 only detects the orientation of the hand and cannot detect an orientation of a substrate before it is held by the hand. If the orientation of the substrate is not appropriate, the substrate may be damaged during the process of being held by the robot.

The present disclosure is made in view of the situation described above, and its purpose is to accurately detect an orientation of a substrate to be transferred before a robot takes out the substrate and holds it.

Means for Solving the Problems

The problem to be solved by the present disclosure is as described above. The means to solve this problem and the effects thereof will be described below.

A first aspect of the present disclosure provides a robot with a configuration described below. That is, a robot that transfers a substrate includes an arm, a hand, a substrate detector, and a substrate orientation examiner. The hand is installed to the arm and holds and transfers the substrate. The substrate detector detects absence or presence of the substrate in a non-contact manner. The substrate orientation examiner examines an orientation of the substrate based on height information detected by the substrate detector about a height at which the substrate is located when it is not held by the hand.

A second aspect of the present disclosure provides a substrate orientation examination method as follows. That is, in the substrate orientation examination method, a robot that transfers the substrate examines the orientation of the substrate. The robot includes an arm, a hand, and a substrate detector. The hand is installed to the arm and holds and transfers the substrate. The substrate detector detects absence or presence of the substrate in a non-contact manner. The orientation of the substrate is examined based on height information detected by the substrate detector about a height at which the substrate is located when it is not held by the hand.

In these manner, an examination of the orientation of the substrate can be made before it is took out from a substrate storage apparatus or the like. Therefore, when the hand moves, unintended contact between the hand and the substrate that occurs due to an inappropriate orientation of the substrate can be avoided. As a result, the substrate can be prevented from, for example, being damaged.

Effects of the Invention

According to the present disclosure, the orientation of the substrate to be transferred can be accurately detected before the robot takes out the substrate and holds it.

EMBODIMENT FOR CARRYING OUT THE INVENTION

Figure 1:
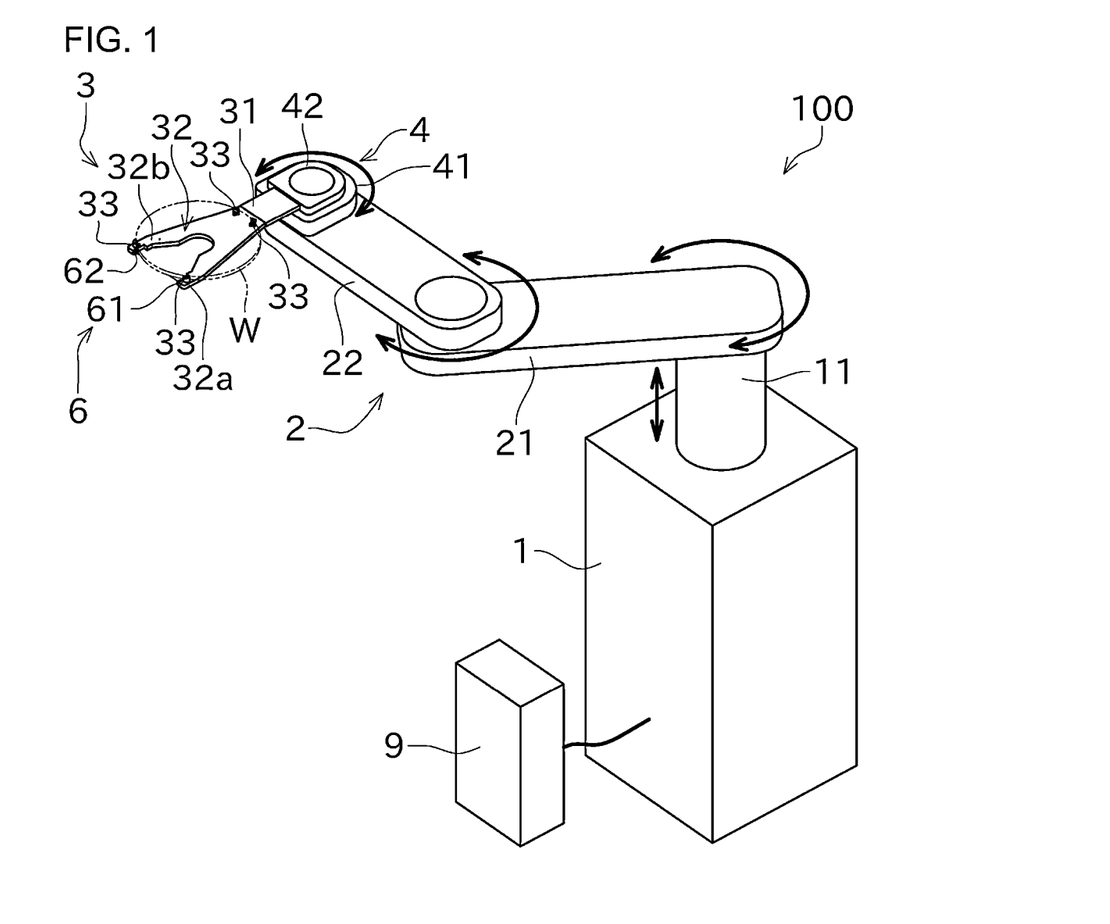
FIG. 1 is a perspective view showing an overall configuration of a robot according to one embodiment of the present disclosure.

The disclosed embodiments will be described below with reference to the drawings. FIG. 1 is a perspective view showing an overall configuration of a robot 100 according to one embodiment of the present disclosure.

The robot 100 shown in FIG. 1 is installed, for example, in a plant for the manufacture of a substrate W, such as a semiconductor wafer or a printed circuit board, or in a warehouse for storing the substrate W. The robot 100 is used to transfer the substrate W between a substrate processing apparatus and a substrate storage apparatus 7 which is described below. Note, however, that the robot 100 may also be used, for example, to transfer the substrate W between multiple substrate processing apparatuses that process the substrate W. The substrate W may be any of the following: a raw material for a substrate, a semi-finished product in process, or a finished product. The substrate W is disc-shaped in the present embodiment, but is not limited to this.

The robot 100 chiefly includes a base 1, a robot arm (an arm) 2, a robot hand (a hand) 3, and a robot controller (a substrate orientation examiner) 9.

The base 1 is fixed to a floor of a factory or the like. Note, however, that the base 1 may also be fixed, for example, to a casing of a substrate processing facility equipped with the aforementioned substrate processing apparatus, without limitation. The base 1 may also be fixed to a moving cart, which is not shown in the drawings, that travels between the substrate processing apparatus (or facility) and the substrate storage apparatus 7.

As shown in FIG. 1, the robot arm 2 is installed to the base 1 with a lifting shaft 11 that can move in the vertical direction installed between them. The robot arm 2 can rotate with respect to the lifting shaft 11.

The robot arm 2 includes a horizontal articulated robot arm. The robot arm 2 includes a first arm 21 and a second arm 22.

The first arm 21 is comprised of an elongated member extending in a horizontal direction. One end of the first arm 21 in the lengthwise direction is installed to the upper end of the lifting shaft 11. The first arm 21 is rotatably supported to rotate around the (vertical) axis of the lifting shaft 11. The second arm 22 is installed to the other end of the first arm 21 in the lengthwise direction.

The second arm 22 is comprised of an elongated member extending in a horizontal direction. One end of the second arm 22 in the lengthwise direction is installed to the distal end of the first arm 21. The second arm 22 is rotatably supported to rotate about an (vertical) axis parallel to the lifting shaft 11. The robot hand 3 is installed to the other end of the second arm 22 in the lengthwise direction.

Each of the lifting shaft 11, the first arm 21 and the second arm 22 is driven by a suitable actuator, not shown in the drawings. These actuators may be, for example, electric motors.

Arm joints are located between the lifting shaft 11 and the first arm 21, between the first arm 21 and the second arm 22, and between the second arm 22 and the robot hand 3. An encoder, not shown in the drawings, is installed at every arm joint and detects rotational position of each of the first arm 21, the second arm 22 and the robot hand 3. Also, at an appropriate location on the robot 100, an encoder that detects changes in the position of the first arm 21 in the height direction (i.e., an amount of lift of the lifting shaft 11) is installed.

Based on positional information of the first arm 21, the second arm 22, or the robot arm 3 including information about their rotational position or vertical position detected by the corresponding encoder, the robot controller 9 controls the operation of each of the electronic motors that drives one of the lifting shaft 11, the first arm 21, the second arm 22, and the robot hand 3. In the following description, the term "positional information" detected by the encoders shall mean a combination of positional information detected by each encoder that represents the pose of the robot 100.

The robot hand 3 includes a wrist 31 and a hand body 32, as shown in FIG. 1.

The wrist 31 is attached to the distal end of the second arm 22 with a tilter 4 installed between them. The wrist 31 is rotatably supported to rotate about an (vertical) axis parallel to the lifting shaft 11. Note, however, that the axis of rotation of the wrist 31 can be tilted with respect to a line parallel to the lifting shaft 11 by using the tilter 4. The configuration of the tilter 4 is described in detail below. The wrist 31 is rotationally driven by a suitable actuator that is not shown in the drawings. This actuator may be, for example, an electric motor. The hand body 32 is connected to the wrist 31. The wrist 31 and the hand body 32 may be provided as one integrally formed member.

The hand body 32 is a member that acts in order to hold the substrate W. The hand body 32 includes a plate-like member formed in a Y-shape (or a U-shape). One end portion of the hand body 32 which is not connected to the wrist 31 (in other words, the distal portion) is split in two. In the following description, each of the bifurcated portions may be referred to as a first finger 32a and a second finger 32b.

Figure 4:
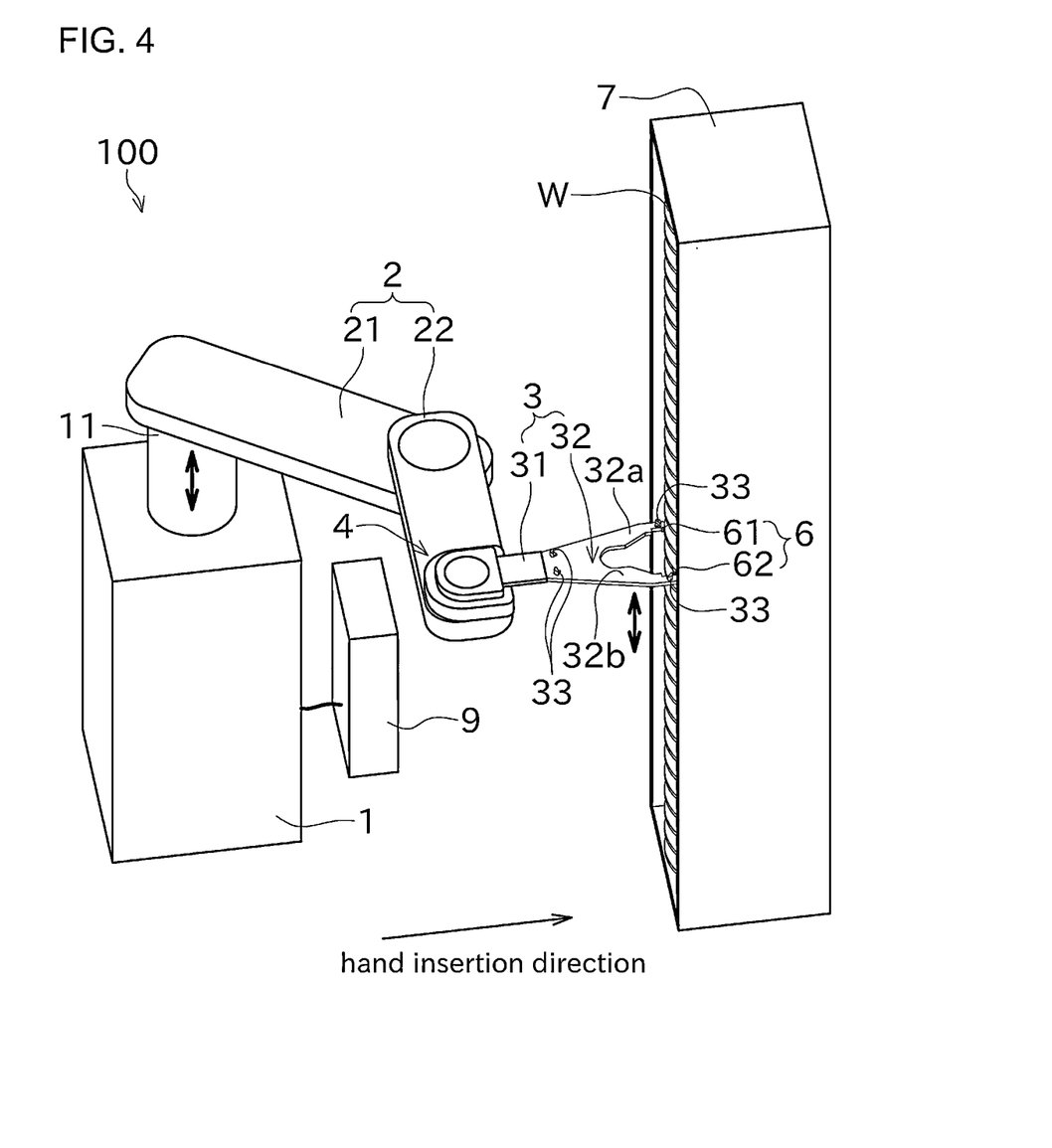
FIG. 4 is a drawing illustrating a robot examining an orientation of a substrate.
Figure 5:
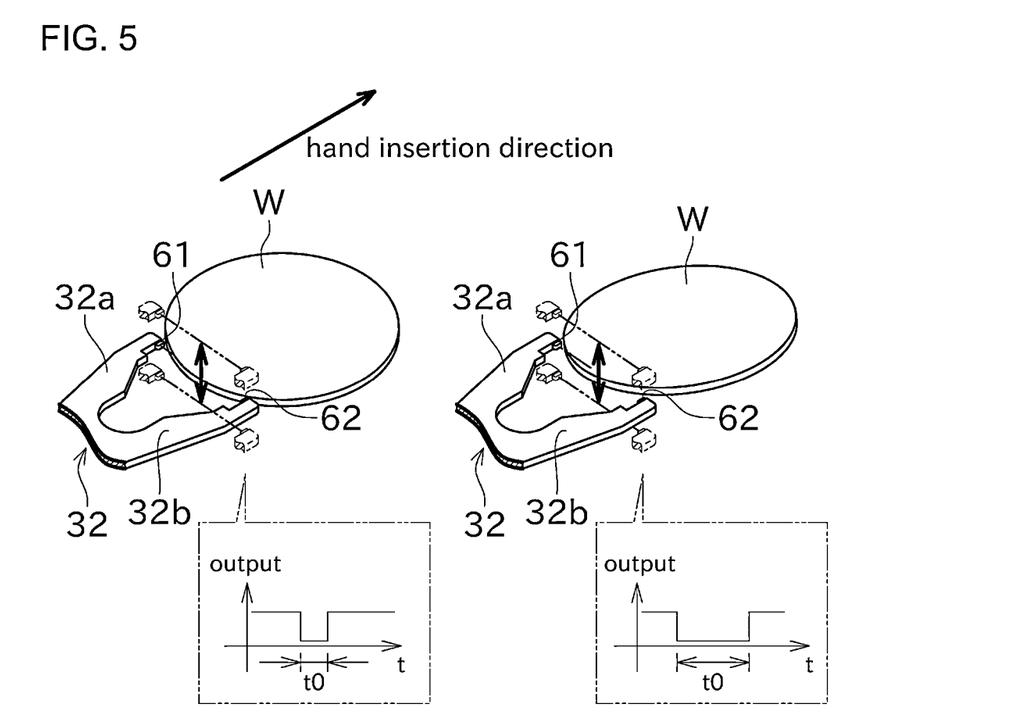
FIG. 5 is an enlarged drawing illustrating a robot hand moving up and down with respect to a substrate.

The first finger 32a and the second finger 32b are formed to be symmetrical with each other. As shown in FIG. 4 and FIG. 5, a suitable distance is formed between the tips of the first finger 32a and the second finger 32b. This allows the edge of the substrate W to be positioned between the tips of the first finger 32a and the second finger 32b without the robot hand 3 coming into contact with the substrate W.

More than one guide member 33 for holding the substrate W is installed both on the distal portion and on the proximal portion of the hand body 32 of the present embodiment. The guide members 33 are comprised of, for example, rubber. The guide members 33 are installed to project upward from the hand body 32, which is a plate-like member. For example, as shown in FIG. 1, one guide member 33 is installed on each of the first finger 32a and the second finger 32b, and two guide members 33 are installed on the proximal end portion of the hand body 32.

As shown in FIG. 1, the guide members 33 contact portions of the bottom surface of the substrate W close to its rim and they hold the substrate W placed on the robot hand 3. By contacting the rim of the substrate W from the outside of the substrate W in the radial direction, the guide members 33 regulate the substrate W placed on the robot hand 3 so that it does not slide in the horizontal direction.

The configuration of the robot hand 3 to hold the substrate W is not limited to the configuration described above. The robot hand 3 may hold the substrate W by, for example, a structure that suctions the top surface or the bottom surface of the substrate W with negative pressure. For example, the robot hand 3 may be equipped with a known Bernoulli chuck to hold the substrate W in a non-contact manner.

The tilter 4 is installed to the distal portion of the second arm 22 (to the end portion opposite to the other end portion connected to the first arm 21).

Figure 2:
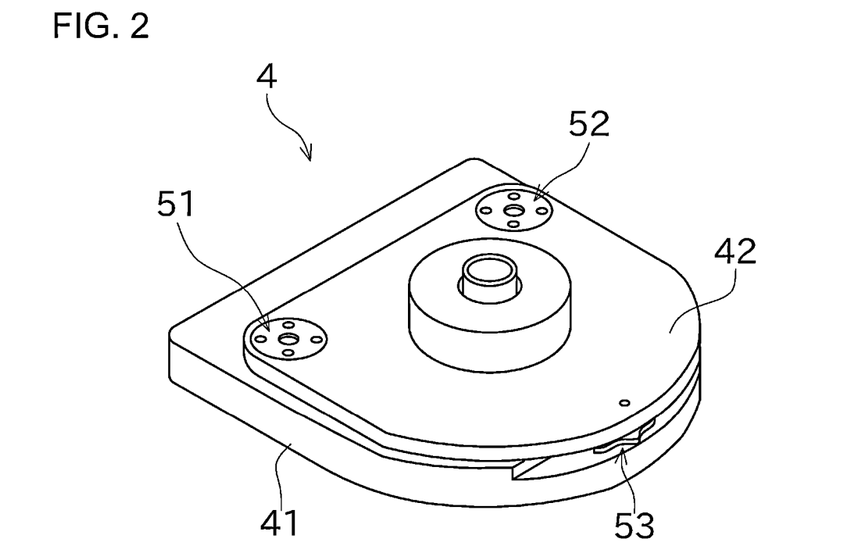
FIG. 2 is a perspective view showing an example of a tilter.

The tilter 4 includes a bottom plate 41 and the top plate 42 as shown in FIG. 2. The bottom plate 41 is fixed to the top surface of the second arm 22. The top plate 42 rotatably supports the wrist 31 of the robot hand 3. A height adjuster 5 is located between the bottom plate 41 and the top plate 42. The tilter 4 adjusts the angle and direction of a tilt of the top plate 42 with respect to the bottom plate 41 by using this height adjuster 5.

Figure 3:
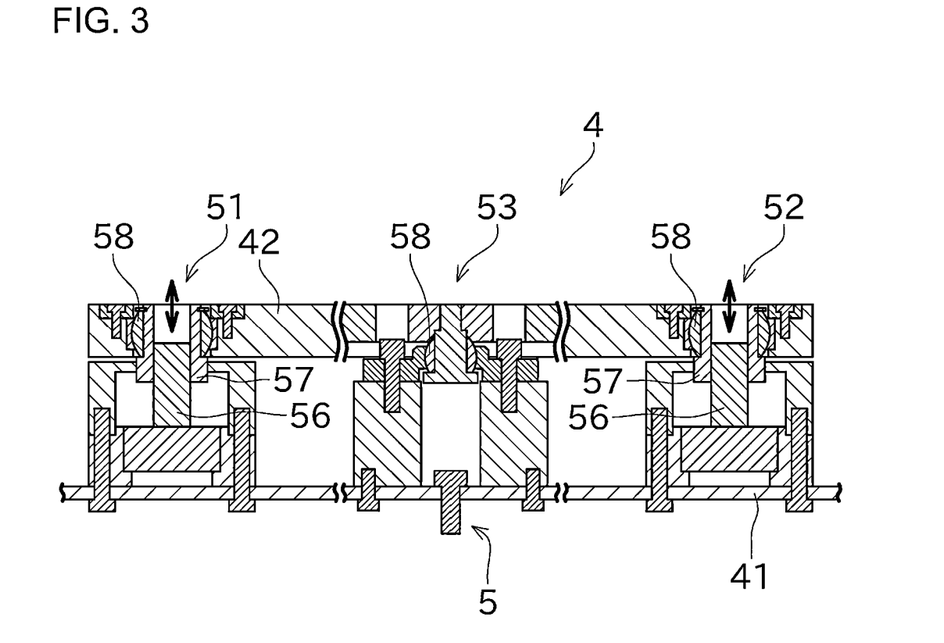
FIG. 3 is a cross-sectional view showing an example of a tilter.

The height adjuster 5 includes, for example, three supports 51, 52, 53 arranged at different positions between the bottom plate 41 and the top plate 42 as shown in FIG. 2. In FIG. 3, the supports 51, 52, and 53 are drawn as they are positioned in a straight line for convenience of explanation, but in actuality, as shown in FIG. 2, they are arranged to form a triangle in a plan view.

Each of the supports 51 and 52 includes an externally threaded member 56, an internally threaded member 57, and a spherical bearing 58. The threaded shafts of the externally threaded members 56 are rotatably supported by the bottom plate 41 with their axes pointing in a vertical direction. Actuators (for example, electric motors), that are not shown in the drawings, can separately rotate each of these threaded shafts arranged in the two supports, 51 and 52. Each of the internally threaded members 57 is coupled with the threaded shaft of the corresponding externally threaded member 56. When the threaded shaft is rotated, the corresponding internally threaded member 57 moves in a vertical direction. This movement allows the height at which the supports 51 and 52 support the top plate 42 to be changed. The spherical bearings 58 are located between the internally threaded members 57 and the top plate 42.

A spherical bearing 58 is arranged at the support 53. The support 53 does not have such function to change the height of support by using threads.

With the electric motors driven, the supports 51 and 52 independently change the height of the top plate 42 with respect to the bottom plate 41. In this manner, the angle and the direction of the tilt of the top plate 42 with respect to the bottom plate 41 are changed. As a result, the orientation (the angle and direction of the tilt) of the robot hand 3 with respect to the second arm 22 is adjusted. Note that, the configuration of the height adjuster 5 (and thus the tilter 4) is not limited to this configuration described above.

The robot controller 9 stores results of detection made by the encoders corresponding to the orientation of the robot hand 3 as information about the orientation of the robot hand 3. In this manner, the robot controller 9 can replicate the orientation of the robot hand 3 as memorized by controlling the electric motors that drive elements of the robot 100 (such as the lifting shaft 11, the first arm 21, the second arm 22, and the robot hand 3) in order to match results of detection made by the encoders that detect an orientation of the robot hand 3 to the stored information about the orientation of the robot hand 3.

As shown in FIG. 1, a mapping sensor (a substrate detector) 6 is arranged at the distal portion of the hand body 32. The mapping sensor 6 allows a check of the presence or absence of the substrate W (that is, mapping) to be done in a non-contact manner. In the present embodiment, the mapping sensor 6 is comprised of, for example, a through-beam sensor including a light emitter 61 and a light receiver 62. Without limitation, the mapping sensor 6 may also be comprised of, for example, a reflective sensor.

As shown in FIG. 1 and in FIG. 4, the light emitter 61 is installed on the distal portion of the first finger 32*a*. The light receiver 62 is installed on the distal portion of the second finger 32*b*. The light emitter 61 emits a detection light toward the light receiver 62. The detection light may be, for example, but not limited to, infrared light.

The light receiver 62 is connected to the robot controller 9 wirelessly or by wire. The light receiver 62 outputs an electrical signal to the robot controller 9 indicating whether or not the detection light is received. When there is no object (for example, the substrate W) between the light emitter 61 and the light receiver 62, the detection light emitted from the light emitter 61 reaches the light receiver 62 and the light receiver 62 outputs an electrical signal indicating that the light is received. When there is an object between the light emitter 61 and the light receiver 62, the detection light emitted from the light emitter 61 is blocked by the substrate W, and the light receiver 62 outputs an electrical signal indicating that the light is not received.

When a plurality of spaces for placing the substrate W are arranged at suitable intervals in the vertical direction in the substrate storage apparatus 7, the robot controller 9 moves the robot hand 3 in the vertical direction across these spaces for placing, keeping the distal end of the robot hand 3 close to these spaces (mapping operation). At this time, the robot hand 3 is placed at such a position in a plan view that, when the substrate W is placed in the said space, the robot hand 3 is out of contact with the substrate W and the mapping sensor 6 can detect the substrate W. Based on the time-series data output from the mapping sensor 6 while the robot hand 3 is moved in the vertical direction, the presence or absence of the substrate W at each space for placing can be determined.

However, it is not limited to the above configuration. For example, when the robot hand 3 is moved in the vertical direction, the presence or absence of the substrate W may be determined corresponding to the positional information detected by the encoders, based on the output form the mapping sensor 6 corresponding to each position of the robot hand 3. In this case, the information about the presence or absence of the substrate W obtained from the output of the mapping sensor 6 and the positional information detected by the encoders are associated with each other.

As long as the light receiver 62 can detect the light emitted from the light emitter 61, the light emitter 61 and the light receiver 62 may be located any places of the robot hand 3. For example, the light emitter 61 may be built into the first finger 32*a* and the light receiver 62 may be built into the second finger 32*b*.

As shown in FIG. 1, the robot controller 9 is arranged separately from the base 1. Note, however, that the robot controller 9 may be arranged inside the base 1. The robot controller 9 is configured as a known computer and includes a processing unit, such as a microcontroller, a CPU, a MPU, a PLC, a DSP, an ASIC or a FPGA, a memory unit, such as a ROM, a RAM or a HDD, and a communication unit that can communicate with an external apparatus. The memory unit stores a program to be executed by the processing unit, various thresholds, data on the shape of the substrate W to be transferred, such as thickness and size, or the like. The communication unit is configured to transmit results of the detection made by various sensors (for example, the mapping sensor 6 and the encoders) to the external apparatus and to receive the information about the substrate W or the like from the external apparatus.

The examination of the orientation of the substrate W by the robot 100 of the present embodiment will be described in detail below with reference to the drawings from FIG. 4 to FIG. 6. The following description will be with reference to an example wherein an orientation of the substrate W stored in the substrate storage apparatus 7 is detected. In the following description, some configurations may be omitted in the drawings in order to illustrate each configuration of portions in a comprehensible way.

The substrate storage apparatus 7 shown in FIG. 4 is used to store the substrates W. In the substrate storage apparatus 7, a plurality of substrates (for example, 100 or more substrates) are placed at regular intervals in the vertical direction (i.e., the heightwise direction of the substrate storage apparatus 7) and stored.

In the substrate storage apparatus 7, the substrates W are usually stored in horizontal poses. However, for some reason, such as deformation of a shelf or presence of a foreign substance, sometimes the substrate W is stored in the substrate storage apparatus 7, having a non-horizontal orientation. The robot 100 of the present embodiment can examine the orientation of the substrate W (i.e., a tilt of the substrate W with respect to a horizontal plane or to the robot hand 3)

before taking the substrate W out from the substrate storage apparatus 7 and transferring it.

Although the substrate W can tilt three-dimensionally, in the present embodiment, a tilt of the substrate W with respect to a horizontal plane observed with a line of sight along the direction in which the robot hand 3 is inserted into the substrate storage apparatus 7 (hereinafter, this direction is referred to as the hand insertion direction) is examined. In other words, the target to be examined is a tilt of the substrate W in the roll direction with respect to the hand insertion direction.

Specifically, as shown in FIG. 4, the robot controller 9 moves the robot hand 3 so that a portion of the substrate W to be examined is positioned between the first finger 32a and the second finger 32b, keeping the hand body 32 horizontal. At this time, the detection light emitted from the mapping sensor 6 is directed so as to be parallel to the suitable orientation of the substrate W.

Then, the robot controller 9 moves the lifting shaft 11 in the vertical direction to move the robot hand 3 in the vertical direction keeping it horizontal. As a result, a vertical scan is accomplished by the mapping sensor 6. For example, as shown in FIG. 5, the robot hand 3 moves from below to above or from above to below the substrate W. It is preferable to keep a speed of the movement of the robot hand 3 constant at this time in terms of ease of calculation of a detected thickness TH1 which is described below.

When a portion of the substrate W passes between the first finger 32a and the second finger 32b of the robot hand 3, the light emitted from the light emitter 61 is blocked by the substrate W. As a result, the output signal of the light receiver 62 changes, for example, as shown in the graphs in FIG. 5.

The robot controller 9 calculates an interrupted time t0 during which the light emitted from the light emitter 61 is interrupted by the substrate W while the robot hand 3 is moved in the vertical direction by analyzing time-series data which is based on the output of the light receiver 62. The interrupted time t0 can be referred to as a time of detection for which the mapping sensor 6 detects the presence of the substrate W. The robot controller 9 calculates a distance in which the robot hand 3 moves in the vertical direction during the calculated interrupted time t0 and determine it as a detected thickness TH1 of the substrate W to be examined. The detected thickness TH1 corresponds to the difference between the maximum value and the minimum value of the heights at which the presence of the substrate W is detected (height information).

Figure 6:
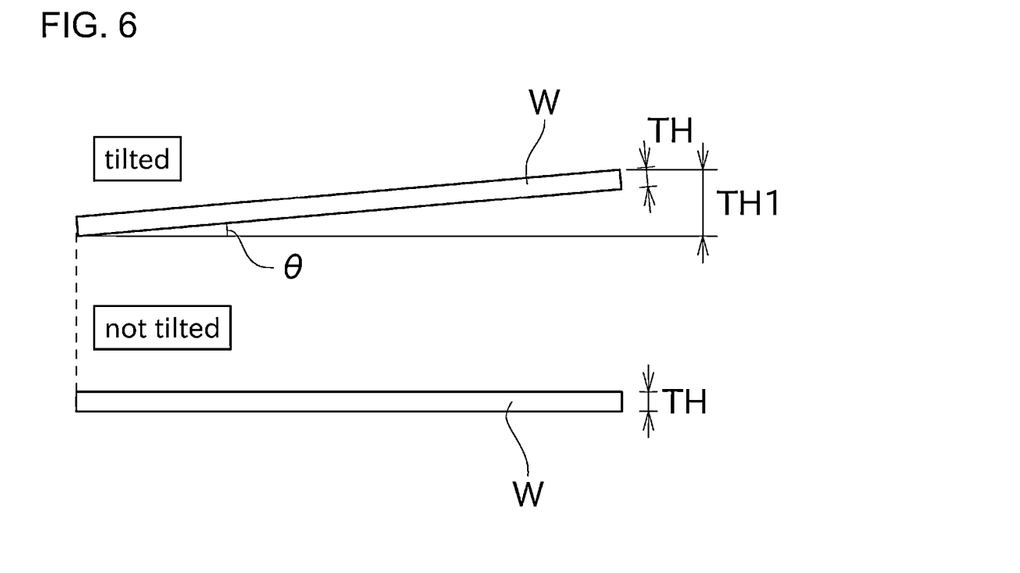
FIG. 6 is an illustrative drawing showing a change in a detected thickness due to a tilt of a substrate.

As shown in FIG. 6, when the substrate W is placed horizontally with respect to the robot hand 3, a distance in which the robot hand 3 moves during the light emitted from the light emitter 61 is interrupted equals an actual thickness TH of the substrate W. On the other hand, when the substrate W is tilted with respect to the robot hand 3, a distance in which the robot hand 3 moves during the light emitted from the light emitter 61 is interrupted exceeds the actual thickness TH of the substrate W.

The robot controller 9 compares the detected thickness TH1 of the substrate W calculated as described above with the actual thickness TH of the substrate W memorized by the memory unit and determines whether the substrate W to be examined is tilted or not using the above-described theory.

There are various method for the determination. For example, the determination may be made by comparing the difference between the detected thickness TH1 and the actual thickness TH of the substrate W to be examined with the predetermined threshold. In this case, the robot controller 9 determines that the substrate W to be examined is tilted when the difference between them exceeds the threshold.

The actual thickness TH of the substrate W may be calculated in advance based on data, such as a design data and a manufacturing data of the substrate W. Also, an average thickness obtained by measuring more than one substrate W may be used as the actual thickness TH. The robot controller 9 receives the actual thickness TH obtained as described above from an external apparatus via the communication unit in advance and stores it in the memory unit.

When it is determined that the substrate W is tilted, the robot controller 9 performs appropriate control. Examples of the control may include excluding the substrate W concerned from targets to be transferred or stopping its operation. In this manner, the robot hand 3 does not insert itself into a space in the substrate storage apparatus 7 which corresponds to the substrate W that has an inappropriate orientation so that the substrate W and the robot hand 3 do not come into contact with each other and the substrate W is prevented from, for example, being damaged.

When a plurality of substrates W are arranged vertically, orientations of the substrates W may be examined with a single vertical movement of the robot hand 3. It is preferable to obtain time-series data output by the mapping sensor 6 which is used to determine the presence or absence of the substrate W and to examine an orientation of the substrate W with a single vertical movement of the robot hand 3 in terms of reducing cycle time.

As described above, the robot 100 of the present embodiment is used to transfer the substrate W. The robot 100 includes the robot arm 2, the robot hand 3, the mapping sensor 6, and the robot controller 9. The robot hand 3 is installed to the robot arm 2 and holds and transfers the substrate W. The mapping sensor 6 detects the presence or absence of the substrate W in a non-contact manner. The robot controller 9 examines an orientation of the substrate W based on a height detected by the mapping sensor 6 at which the substrate W is located when it is not held by the robot hand 3.

This allows an examination of the orientation of the substrate W to be made before the substrate W is taken out from an apparatus, such as the substrate storage apparatus 7. Therefore, unintended contact between the robot hand 3 and the substrate W due to an inappropriate orientation of the substrate W is prevented from occurring while the robot hand 3 is moving. As a result, the substrate W is prevented from, for example, being damaged.

In the robot 100 of the present embodiment, the mapping sensor 6 is installed to the robot hand 3. The robot controller 9 determines the maximum value and the minimum value of heights at which the presence of the substrate W is detected based on the output from the mapping sensor 6 while the robot hand 3 is vertically moved. The robot controller 9 examines the orientation of the substrate W based on the detected thickness TH1, which is the difference between the maximum value and the minimum value, and the actual thickness TH of the substrate W.

This allows an easy and accurate examination of the orientation of the substrate W with a simple configuration.

The robot 100 of the present embodiment is also equipped with the tilter 4 that tilts an orientation of the robot hand 3 in a desired direction.

This allows an orientation of the mapping sensor 6, which serves as a basis for an examination of the orientation of the substrate W, to be adjusted with a great flexibility.

Figure 7:
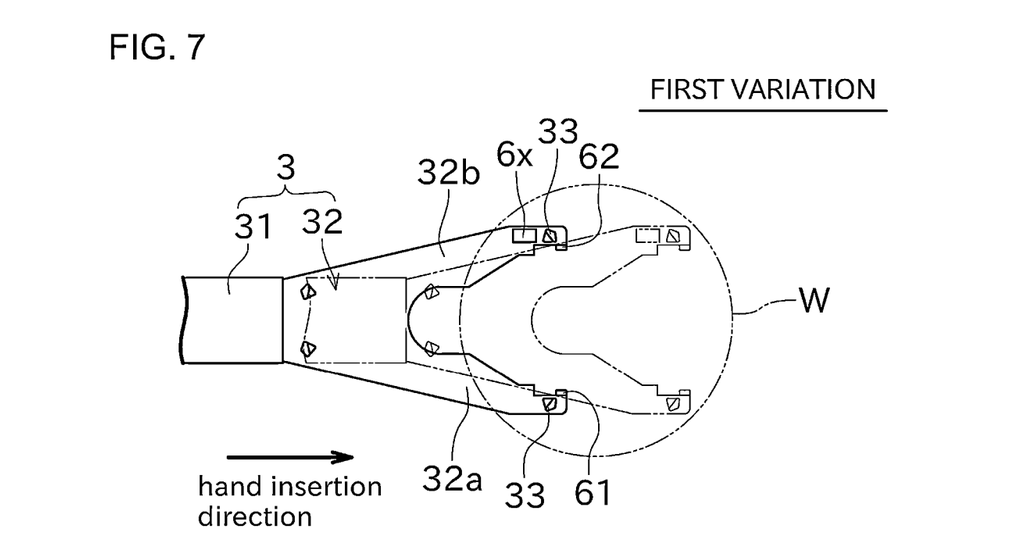
FIG. 7 is a plan view illustrating an examination of a tilt of a substrate in a first variation.

Next, a first variation of the embodiment described above will be explained below. FIG. 7 is a plan view illustrating an examination of a tilt of the substrate W in the first variation. In the description of the present variation, the same or similar components as that of the above-described embodiment may be marked with the same references in the drawings and the description thereof may be omitted.

The robot 100 of the present variation includes a rangefinder 6x in addition to the mapping sensor 6. The rangefinder 6x and the mapping sensor 6 are comprised in the substrate detector. The rangefinder 6x detects a tilt of the substrate W with respect to a horizontal plane observed with a line of sight along the direction perpendicular to the hand insertion direction. In other words, the target to be examined by the rangefinder 6x is a tilt of the substrate W in the pitch direction with respect to the hand insertion direction. In the present embodiment, results of the detection made by the rangefinder 6x correspond to height information.

The rangefinder 6x includes, for example, a laser displacement meter or an ultrasonic distance sensor. The rangefinder 6x is, as shown in FIG. 7, for example, installed on the top surface of the second finger 32b of the hand body 32. The rangefinder 6x detects a vertical distance between the rangefinder 6x itself and the bottom surface of the substrate W in a non-contact manner. The rangefinder 6x is connected to the robot controller 9 wirelessly or by wire, and transmits data of the distance to the substrate W measured at the measurement position to the robot controller 9.

The robot controller 9 inserts the robot hand 3 below the substrate W supported in the substrate storage apparatus 7. In this manner, the rangefinder 6x faces the substrate W vertically. Note that the guide member 33 does not hold the substrate W at this time. By moving the robot hand 3 horizontally along the hand insertion direction, the robot controller 9 measures distances between the rangefinder 6x and the substrate W to be examined at least at two points.

The robot controller 9 determines whether the substrate W is tilted with respect to a horizontal plane based on the difference of heights of the substrate W measured by the rangefinder 6x.

When the substrate W is absent, the rangefinder 6x measures an abnormal value. Therefore, the rangefinder 6x can be considered as a sensor that can substantially detect the presence or absence of the substrate W.

In the above-described embodiment, the mapping sensor 6 examines a tilt of the substrate W in the roll direction as observed with a line of sight along the hand insertion direction. In addition, in the present variation, the rangefinder 6x examines a tilt of the substrate W in the pitch direction. Thus, in the present variation, the tilt of the substrate W can be examined three-dimensionally.

As described above, in the robot 100 of the present variation, the rangefinder 6x is installed to the hand body 32 in order to measure a vertical distance to the substrate W. The robot controller 9 examines an orientation of the substrate W based on each of the distances measured by the rangefinder 6x at multiple points of the substrate W.

This allows an easy and accurate examination of the orientation of the substrate W with a simple configuration.

Figure 8:
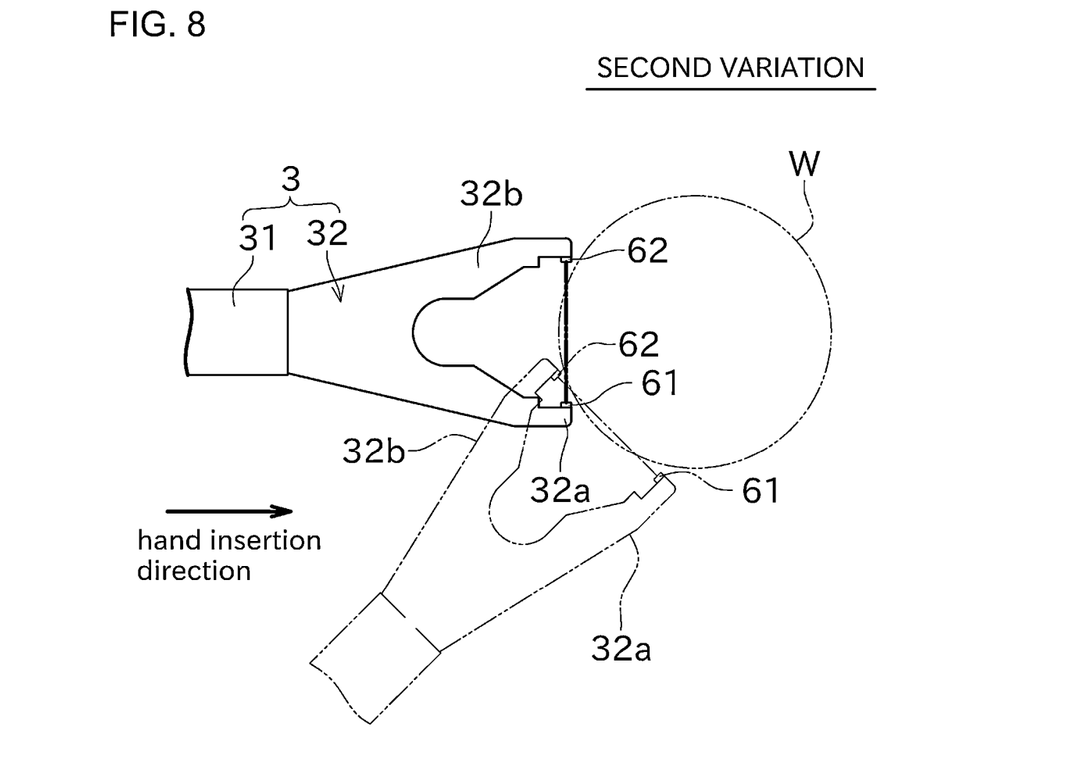
FIG. 8 is a plan view illustrating an examination of a tilt of a substrate in a second variation.

Next, a second variation of the above-described embodiment will be explained below. FIG. 8 is a plan view conceptually illustrating an examination of a tilt of the substrate W in the second variation. In the description of the present variation, the same or similar components as that of the above-described embodiment may be marked with the same references in the drawings and the description thereof may be omitted.

The robot 100 of the present variation includes only the mapping sensor 6 as the substrate detector. In other words, the robot 100 does not include the rangefinder 6x.

As illustrated by the solid line in FIG. 8, the robot 100 of the present variation obtains the detected thickness TH1 by performing the same measurement as in the above-described embodiment, with the orientation of the detection light of the mapping sensor 6 in a plan view varied at each time. The tilt can be determined by comparing the detected thickness TH1 with the actual thickness TH in the same way as described above. The choice of orientations of the detection light is not limited to the example shown in FIG. 8. It can be changed variously.

In the present variation, the tilt of the substrate W can be three-dimensionally examined by using two detected thicknesses TH1.

Figure 9:
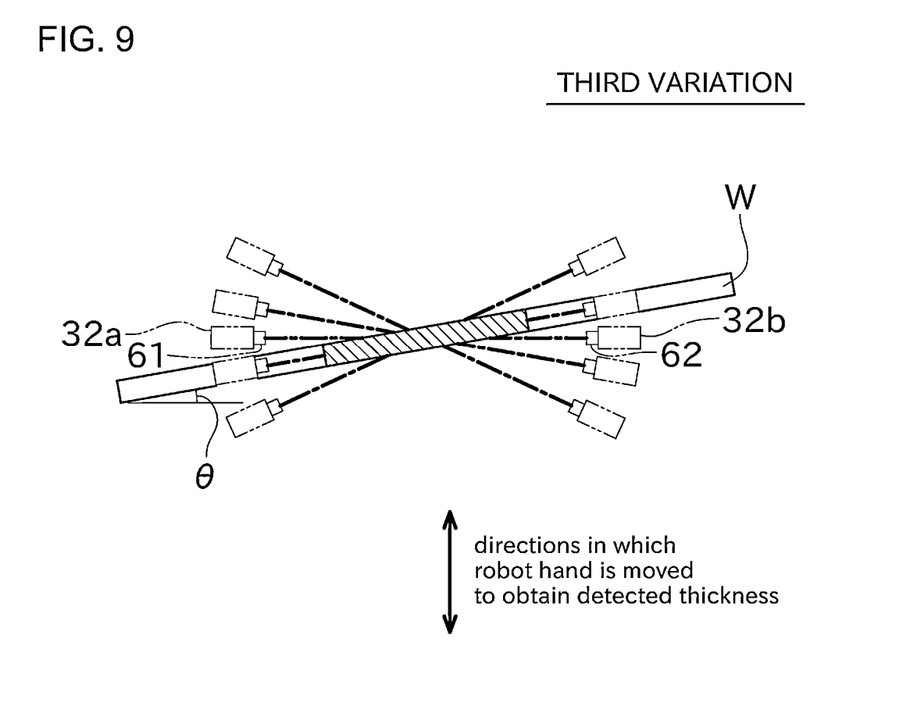
FIG. 9 is a drawing conceptually illustrating an orientation of a detection axis of a mapping sensor being changed in order to detect a tilt of a substrate in a third variation.

Next, a third variation of the above-described embodiment will be explained below. FIG. 9 is a drawing conceptually illustrating an orientation of a detection axis of the mapping sensor 6 being changed in order to detect a tilt of the substrate W in the third variation. In the description of the present variation, the same or similar components as that of the above-described embodiment may be marked with the same references in the drawings and the description thereof may be omitted.

In the present variation, as shown in FIG. 9, the robot controller 9 obtains the detected thickness TH1 multiple times with the direction and magnitude of a tilt of the detection light of the mapping sensor 6 suitably varied at each time. Specifically, the robot controller 9 tilts the orientation of the detection light of the mapping sensor 6 in the roll direction by suitably tilting the robot hand 3 with respect to a horizontal plane. Then, the robot controller 9 moves the robot hand 3 up and down to obtain the detected thickness TH1 corresponding to a titled orientation of the robot hand 3.

After obtaining the multiple detected thicknesses TH1 in this manner, the robot controller 9 determines an angular degree of a tilt of the detection light corresponding to one of the detected thicknesses TH1 that is closest in value to the actual thickness TH. This angular degree of the tilt corresponds to a tilt angle $\theta$ of the substrate W in the roll direction. The tilt angle $\theta$ can be used as an indicator of how much the orientation of the substrate W deviates from the orientation that it should have.

As described above, in the robot 100 of the present variation, the robot controller 9 obtains the tilt angle $\theta$ that indicates the magnitude of the tilt of the substrate W, by making an examination while changing the orientation of the robot hand 3 by the tilter 4.

This allows an orientation of the substrate W to be specifically detected.

While the preferred embodiment and the variations of the present disclosure have been described above, the configurations described above may be modified as follows, for example.

The detected thickness TH1 may be determined based on results of detection made by the encoders (that is, positional information detected by the encoders) at times when the mapping sensor 6 starts outputting data indicating that no light is received and when it finishes outputting, instead of based on a vertical distance the robot hand 3 moves while the mapping sensor 6 is outputting data indicating that no light is received. In this case, the positional information detected by the encoders corresponds to the height information. In a case where the presence or absence of the substrate W is detected by the robot hand 3 moving up and down with its orientation maintained, the detected thickness TH1 may be calculated by using results of the detection made only by the encoder that detects a positional change of the first arm 21 in the height direction (that is, the distance that the lifting shaft 11 moves).

The robot 100 may hold an object, such as a tray carrying the substrate W, instead of directly holding the substrate W to transfer.

The hand body 32 of the robot hand 3 may be integrally formed with the top plate 42 of the tilter 4.

The tilter 4 may be arranged between the base 1 and the lifting shaft 11, or between the lifting shaft 11 and the first arm 21, or between the first arm 21 and the second arm 22.

In the embodiment shown in FIG. 5 and FIG. 6, the tilt angle θ of the substrate W may be calculated by somehow determining positions in a plan view at which the light emitter 61 and the light receiver 62 are located with respect to the substrate W. This calculation can be easily made by performing a geometric calculation based on the detected thickness TH1. The same applies to the variations shown in FIG. 7 and FIG. 8.

In the first variation shown in FIG. 7, the mapping sensor 6 may be omitted. In this case, the tilt of the substrate W in the pitch direction can still be examined by the rangefinder 6x that horizontally scans the substrate W along the hand insertion direction. Also, to examine the tilt of the substrate W, the rangefinder 6x may measure heights of three points on the substrate W that form a triangular shape in a plan view, with the robot hand 3 horizontally moved. In this case, the tilt of the substrate W can be three-dimensionally examined by using only the rangefinder 6x.

In the robot hand 3 of the first variation, more than one rangefinder 6x may be arranged at different locations.

The orientation of the substrate W may be examined by an apparatus other than the robot controller 9.

The functionality of the elements disclosed herein may be implemented using circuitry or processing circuitry which includes general purpose processors, special purpose processors, integrated circuits, ASICs ("Application Specific Integrated Circuits"), conventional circuitry and/or combinations thereof which are configured or programmed to perform the disclosed functionality. Processors are considered processing circuitry or circuitry as they include transistors and other circuitry therein. The processor may be a programmed processor which executes a program stored in a memory. In the disclosure, the circuitry, units, or means are hardware that carry out or are programmed to perform the recited functionality. The hardware may be any hardware disclosed herein or otherwise known which is programmed or configured to carry out the recited functionality. When the hardware is a processor which may be considered a type of circuitry, the circuitry, means, or units are a combination of hardware and software, the software being used to configure the hardware and/or processor.

The invention claimed is:

1. A robot that transfers a substrate, comprising:
   an arm;
   a hand that is installed to the arm and holds and transfers the substrate, wherein the hand includes a first finger and a second finger separated along a separation direction;
   a mapping sensor including a transmitter installed on the first finger and a receiver installed on the second finger, wherein the mapping sensor detects:
      absence or presence of the substrate between the first finger and the second finger using a detection light, and
      a height, along a direction perpendicular to the separation direction, at which the substrate is located when not held by the hand; and
   control circuitry configured to determine a magnitude of a tilt of the substrate, by examining an orientation of the substrate while the orientation of the hand is changed, based on a plurality of detected thicknesses, wherein
   each of the plurality of detected thicknesses is calculated from height information indicating the height detected by the mapping sensor during a vertical movement of the hand, and
   each detected thickness is obtained at a different orientation of the hand in a plan view.

2. The robot according to claim 1, wherein
   the control circuitry determines a maximum value and a minimum value of heights at which the presence of the substrate is detected based on output from the mapping sensor while the hand is vertically moved, and
   the control circuitry examines the orientation of the substrate based on a detected thickness, which is a difference between the maximum value and the minimum value, and an actual thickness of the substrate.

3. The robot according to claim 1, wherein the control circuitry is further configured to acquire roll tilt information based on the output of the mapping sensor.

4. The robot according to claim 1, further comprising a tilter which adjusts an orientation of the hand.

5. The robot according to claim 4, wherein the tilter includes a tilter mechanism located between the arm and the hand.

6. The robot according to claim 5, wherein the tilter includes a top plate supporting the hand and a bottom plate fixed to the arm.

7. The robot according to claim 6, wherein the tilter further includes
   a height adjuster between the top plate and the bottom plate, and
   the height adjuster includes at least two supports which change a height between the top plate and the bottom plate.

8. The robot according to claim 1, wherein the control circuitry is further configured to control movement of the hand in a vertical direction, perpendicular to the separation direction, relative to the substrate for the mapping sensor to perform the scanning and while maintaining the hand oriented along a horizontal orientation.

9. The robot according to claim 8, wherein the control circuitry is further configured to calculate a detected thickness of the substrate based on a distance the hand moved in the vertical direction while the mapping sensor detected the presence of the substrate.

10. The robot according to claim 9, wherein the control circuitry is further configured to determine whether a difference between the calculated detected thickness and a known actual thickness of the substrate exceeds a predetermined threshold.

11. The robot according to claim 10, wherein the control circuitry is further configured to determine that the orientation of the substrate is tilted relative to the detection light in a case that the difference exceeds the predetermined threshold.

12. The robot according to claim 11, wherein in the case that the difference exceeds the predetermined threshold, the control circuitry is further configured to control a tilter to change a tilt of the hand relative to a horizontal plane to change an orientation of the detection light relative to the substrate.

13. The robot according to claim 12, wherein after the tilt of the hand is changed, the control circuitry is configured to acquire a renewed detected thickness by moving the hand vertically relative to the substrate.

14. The robot according to claim 13, wherein the control circuitry is further configured to
acquire multiple detected thicknesses, each corresponding to a different tilt of the detection light, and
determine the orientation of the substrate based on the tilt of the detection light corresponding to a detected thickness closest in value to the known actual thickness.

15. The robot according to claim 8, wherein the control circuitry is configured to control the movement of the hand in the vertical direction at a constant speed during the scanning by the mapping sensor.

16. A substrate orientation examination method applied to a robot that transfers a substrate, the robot including an arm, a hand installed to the arm and a mapping sensor installed to the arm, the method comprising:

detecting, with the mapping sensor which includes a transmitter installed on a first finger of the hand and a receiver installed on a second finger the hand:
  absence or presence of the substrate between the first finger and the second finger using a detection light, and
  a height, the height along a direction perpendicular to the separation direction, at which the substrate is located when not held by the hand; and
determining a magnitude of a tilt of the substrate, by examining an orientation of the substrate based on a plurality of detected thicknesses, wherein
each of the plurality of detected thicknesses is calculated from height information indicating the height detected by the mapping sensor during a vertical movement of the hand, and
each detected thickness is obtained at a different orientation of the hand in a plan view.

\* \* \* \* \*